United States Patent
Maruyama et al.

(10) Patent No.: US 7,808,162 B2
(45) Date of Patent: Oct. 5, 2010

(54) STACKED PIEZOELECTRIC ELEMENT AND VIBRATION WAVE DRIVING APPARATUS

(75) Inventors: Yutaka Maruyama, Tokyo (JP); Tomoyoshi Kato, Sendai (JP)

(73) Assignee: Canon Kabushiki Kaisha (JP)

( * ) Notice: Subject to any disclaimer, the term of this patent is extended or adjusted under 35 U.S.C. 154(b) by 199 days.

(21) Appl. No.: 11/696,177

(22) Filed: Apr. 3, 2007

(65) Prior Publication Data
US 2007/0236107 A1    Oct. 11, 2007

(30) Foreign Application Priority Data
Apr. 11, 2006  (JP) .............................. 2006-108862

(51) Int. Cl.
*H01L 41/00* (2006.01)
(52) U.S. Cl. ...................... 310/364; 310/363; 310/365; 310/366
(58) Field of Classification Search ................. 310/363, 310/364, 365, 366
See application file for complete search history.

(56) References Cited

U.S. PATENT DOCUMENTS

| | | | |
|---|---|---|---|
| 6,281,591 B1 * | 8/2001 | Nakamura | .................. 257/778 |
| 6,351,393 B1 * | 2/2002 | Kresge et al. | ................ 361/795 |
| 6,575,565 B1 * | 6/2003 | Isono et al. | .................... 347/71 |
| 6,747,396 B2 * | 6/2004 | Blom | .......................... 310/328 |
| 7,233,096 B2 * | 6/2007 | Maruyama et al. | ..... 310/323.02 |
| 2005/0104476 A1 * | 5/2005 | Maruyama et al. | .......... 310/328 |

FOREIGN PATENT DOCUMENTS

| | | |
|---|---|---|
| JP | 2004-349688 A | 12/2004 |
| JP | 2005-168281 A | 6/2005 |

* cited by examiner

*Primary Examiner*—Walter Benson
*Assistant Examiner*—Bryan P Gordon
(74) *Attorney, Agent, or Firm*—Rossi, Kimms & McDowell LLP

(57) ABSTRACT

A stacked piezoelectric element comprising a driving unit and a non-driving unit, and a vibration wave driving apparatus, which are capable of suppressing occurrences of deformation, particularly warping, that are generated during firing and polarization of the stacked piezoelectric element. A driving unit has a first conductive layer and a first piezoelectric layer consisting of a piezoelectric material, which is driven by an application of voltage to the first conductive layer to generate vibration on the stacked piezoelectric element. A non-driving unit has a plurality of second conductive layers and a plurality of second piezoelectric layers consisting of the piezoelectric material, which is arranged to have a thickness that enables generation of the vibration.

14 Claims, 9 Drawing Sheets

STACKED PIEZOELECTRIC ELEMENT AND VIBRATION WAVE DRIVING APPARATUS

BACKGROUND OF THE INVENTION

1. Field of the Invention

The present invention relates to a stacked piezoelectric element in which layers of piezoelectric material are stacked, and a vibration wave driving apparatus using the stacked piezoelectric element.

2. Description of the Related Art

Conventionally, piezoelectric material, which is a typical material having electromechanical energy conversion functions, is used as piezoelectric elements in various applications. Recently, in particular, stacked piezoelectric elements in which plurality of layers are stacked, integrally formed and sintered are commonly used. The stacked piezoelectric element provides greater deformation strains and greater power from lower voltage through layer stacking as compared to a single-layer piezoelectric element, and also enables downsizing by reducing the thickness of each of the stacked layers.

Generally, a stacked piezoelectric element comprises piezoelectric layers respectively formed of a plurality of layers of piezoelectric material consisting of piezoelectric ceramics, and electrode layers, which are conductive layers, arranged adjacent to each piezoelectric layer and formed from conductive material. Pluralities of piezoelectric layers and electrode layers are stacked upon each other to form multilayer stacking and sintered. Subsequently, polarization is performed thereon to provide the entire stacked piezoelectric element with piezoelectricity.

Figure 9:
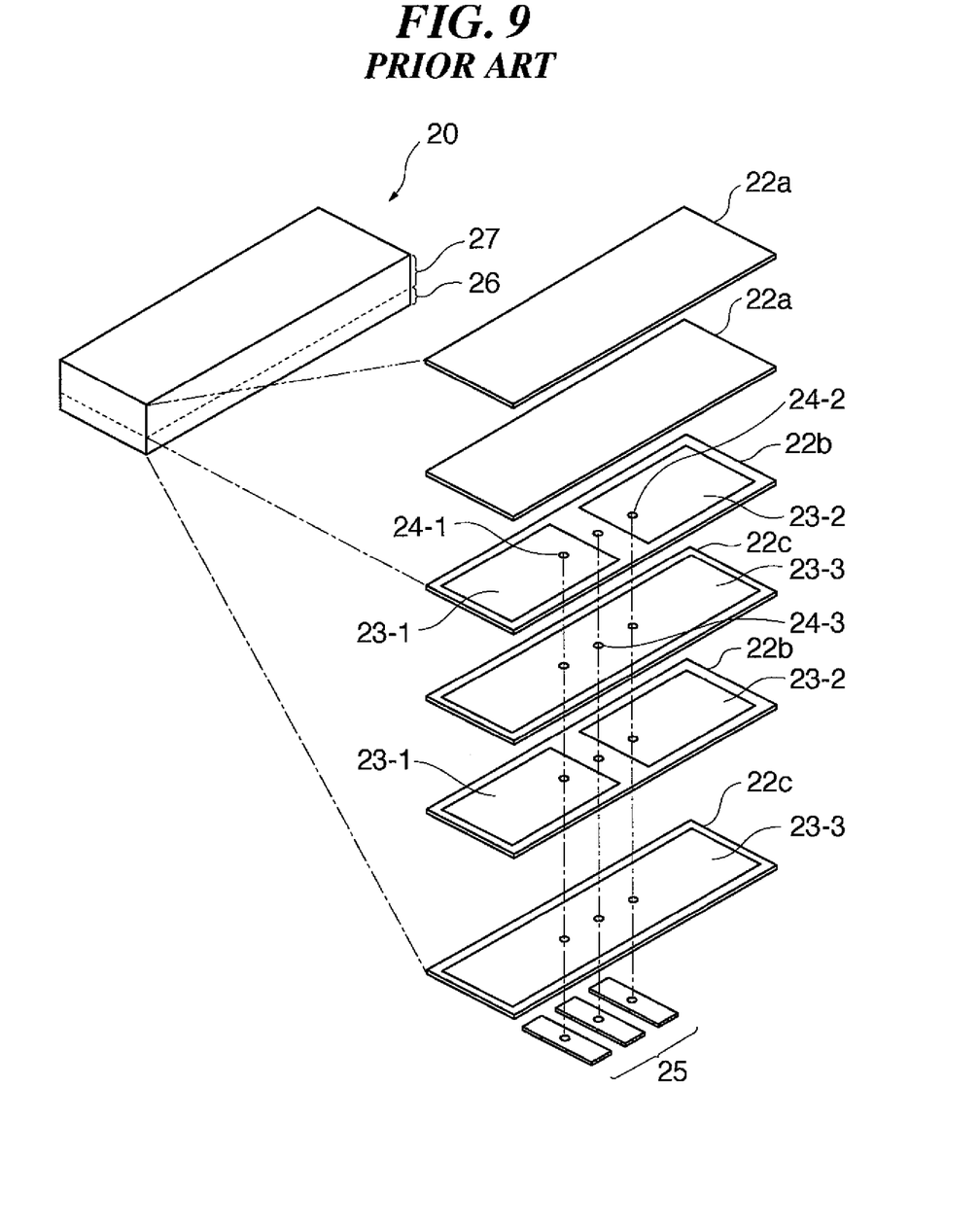
FIG. 9 is a structural diagram of a conventional stacked piezoelectric element.

FIG. 9 is a structural diagram of a conventional stacked piezoelectric element disclosed in Japanese Laid-Open Patent Publication (Kokai) No. 2005-168281.

A stacked piezoelectric element 20 is a vibrating body used in a linearly-driving vibration wave motor, and comprises a driving unit 26 that applies voltage to provide drive and generate vibration, and a non-driving unit 27 that does not apply voltage. The non-driving unit 27 has a thickness that allows generation of bend vibrations.

The non-driving unit 27 comprises a plurality of layers from a first layer to a predetermined layer (for instance, a twentieth layer). Each layer is comprised of a piezoelectric layer 22a that does not have an electrode layer. The driving unit 26 comprises a plurality of layers from a predetermined layer (for instance, a twenty-first layer) to a last layer (for instance, a thirtieth layer), and is configured so that piezoelectric layers 22b on which bisected electrode layers 23-1 and 23-2 are formed and piezoelectric layers 22c on which non-bisected electrode layers 23-3 are formed are alternately stacked upon each other to form multilayer stacking.

The driving unit 26 and the non-driving unit 27 are simultaneously stacked together and fired to configure the stacked piezoelectric element 20. The non-driving unit 27 is set to have a thickness that enables generation of effective bend vibrations at the stacked piezoelectric element 20. If the non-driving unit 27 is too thin, vibration energy generated by the driving unit 26 cannot be extracted as bend vibrations sufficient for driving.

The respective piezoelectric layers 22b having the bisected electrode layers 23-1 and 23-2, and the respective piezoelectric layers 22c having the electrode layers 23-3 that substantially cover the entire surface of the respective piezoelectric layers 22c, are independently electrically connected via throughholes 24-1, 24-2 and 24-3, and are electrically conductive with three surface electrode layers 25 arranged on the surface of the bottommost piezoelectric layer. A throughhole is a hole penetrating the piezoelectric layers 22, which is filled with conductive material. The piezoelectric layers 22b and 22c respectively sandwiched between the electrode layers 23-1, 23-2 and 23-3 are provided with predetermined polarities.

After provided with the above-mentioned polarities, the surface electrode layers 25 at the bottommost face of the stacked piezoelectric element 20 are scraped off by lapping, and a flexible circuit board is adhered to a predetermined position on the surface to enable the stacked piezoelectric element 20 to connect with a driving circuit. Then, by grounding the electrode layer 23-3 of the stacked piezoelectric element 20 and applying a high-frequency voltage having a temporal phase difference to the electrode layers 23-1 and 23-2, two different bend vibrations may be simultaneously generated.

Figure 10:
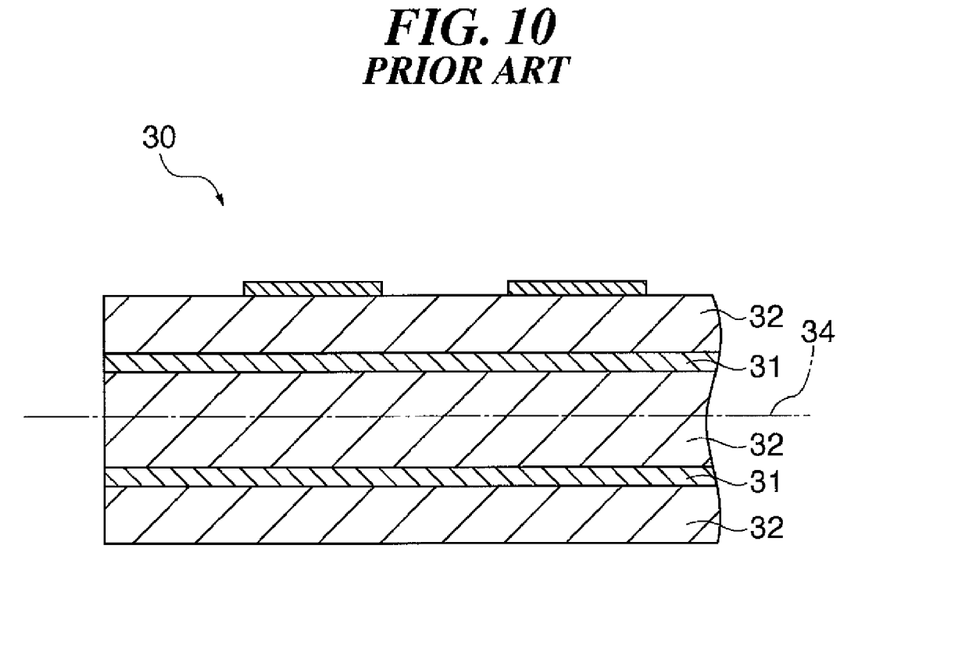
FIG. 10 is a cross-sectional diagram showing a conventional piezoelectric actuator substrate.
Figure 11:
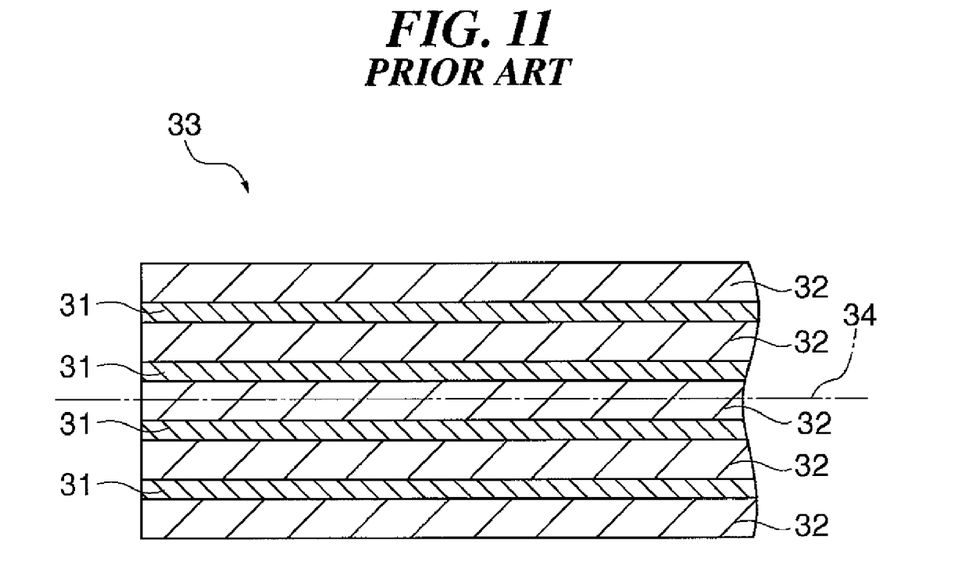
FIG. 11 is a cross-sectional diagram showing another conventional piezoelectric actuator substrate.

On the other hand, wavinesses and warping due to contraction during firing are likely to occur on a piezoelectric actuator substrate formed of a thin plate-like stacked body. In this light, as shown in FIG. 10, there is disclosed in Japanese Laid-Open Patent Publication (Kokai) No. 2004-349688 discloses that high-contraction layers 31 consisting primarily of two layers of conductive material are arranged between each ceramic layer 32 to be axisymmetrical with respect to an imaginary line 34 which passes through a position at one-half thickness of the stacked body and which is parallel to the surface of a piezoelectric actuator substrate 30. Furthermore, as shown in FIG. 11, Japanese Laid-Open Patent Publication (Kokai) No. 2004-349688 also describes high-contraction layers 31 axisymmetrically arranged with respect to the imaginary line 34 in a piezoelectric actuator substrate 33 having three or more ceramic layers 32.

As described in above-described Japanese Laid-Open Patent Publication (Kokai) No. 2005-168281, in the stacked piezoelectric element 20 in which coexist the driving unit 26 having the electrode layers 23-1, 23-2 and 23-3 and the non-driving unit 27 having no electrode layers, during firing, the electrode layers 23-1, 23-2 and 23-3 consisting of conductive material contract earlier than the piezoelectric layers 22a, 22b and 22c consisting of piezoelectric material and are therefore more likely to develop warping and other deformation. In this light, as described in Japanese Laid-Open Patent Publication (Kokai) No. 2004-349688, axisymmetrically arranging the plurality of high-contraction layers 31 consisting primarily of conductive material with respect to the imaginary line 34 of the stacked body is evidently effective in reducing warping.

However, in the stacked piezoelectric element 20 described in Japanese Laid-Open Patent Publication (Kokai) No. 2005-168281, the driving unit 26 has a plurality of electrode layers 23-1, 23-2 and 23-3. In addition, a polarizing surface electrode layer 25 simultaneously fired with the stacked piezoelectric element 20 is provided on the surface of the driving unit 26, and the piezoelectric layers 22a, 22b and 22c are polarized. Since the plurality of polarized piezoelectric layers 22a, 22b and 22c contract in a surface direction in the same manner as the contraction of the electrode layers 23-1, 23-2 and 23-3 during firing, the degree of warping will be further increased. Therefore, merely arranging the plurality of high-contraction layers 31 as described in Japanese Laid-Open Patent Publication (Kokai) No. 2004-349688 is insufficient for suppressing warping.

The existence of such warping means that even when planarizing the surface of the stacked piezoelectric element by performing double-side lapping or grinding, the internal electrode layers will remain warped with respect to the processed planarized surface, and in extreme cases, such warping results in the internal electrode layers exposed on the processed surface.

SUMMARY OF THE INVENTION

The present invention provides a stacked piezoelectric element comprising a driving unit and a non-driving unit, and a vibration wave driving apparatus, which are capable of suppressing occurrences of deformation, particularly warping, that are generated during firing and polarization of the stacked piezoelectric element.

In a first aspect of the present invention, there is provided a stacked piezoelectric element comprising a driving unit having a first conductive layer and a first piezoelectric layer consisting of a piezoelectric material, which is driven by an application of voltage to the first conductive layer to generate vibration on the stacked piezoelectric element, and a non-driving unit having a plurality of second conductive layers and a plurality of second piezoelectric layers consisting of the piezoelectric material, which is arranged to have a thickness that enables generation of the vibration.

With the arrangement of the first aspect of the present invention, occurrences of deformation, particularly warping, which is generated during firing and polarization of a stacked piezoelectric element, may be suppressed.

In a second aspect of the present invention, there is provided a stacked piezoelectric element comprising a plurality of piezoelectric layers consisting of a piezoelectric material, and a plurality of conductive layers formed respectively between at least three of the piezoelectric layers, wherein the plurality of conductive layers includes a first conductive layer that is conductive with an electrode exposed on the surface of the stacked piezoelectric element and a second conductive layer that is not conductive therewith.

In a third aspect of the present invention, there is provided a stacked piezoelectric element comprising at least three first piezoelectric layers consisting of a piezoelectric material, at least three second piezoelectric layers consisting of the piezoelectric material, a plurality of conduction layers formed respectively between the first piezoelectric layers at positions that are conductive with an electrode exposed on the surface of the stacked piezoelectric element, and a plurality of non-conduction layers formed respectively between the second piezoelectric layers at a position that is not conductive with the electrode exposed on the surface of the stacked piezoelectric element, wherein the plurality of non-conduction layers are formed by a material that contracts earlier during firing than the first and second piezoelectric layers.

In a fourth aspect of the present invention, there is provided a vibration wave driving apparatus comprising a stacked piezoelectric element, a vibrating body formed on the surface of the stacked piezoelectric element, and a contact body arranged to, when pressed, contact the vibrating body, the vibration wave driving apparatus relatively displacing the vibrating body and the contact body, wherein the stacked piezoelectric element comprises a driving unit having a first conductive layer and a first piezoelectric layer consisting of a piezoelectric material, which is driven by an application of voltage to the first conductive layer to generate vibration on the stacked piezoelectric element, and a non-driving unit having a plurality of second conductive layers and a plurality of second piezoelectric layers consisting of the piezoelectric material, which is arranged to have a thickness that enables generation of the vibration.

In a fifth aspect of the present invention, there is provided a vibration wave driving apparatus comprising a stacked piezoelectric element, a vibrating body formed on the surface of the stacked piezoelectric element, and a contact body arranged to, when pressed, contact the vibrating body, the vibration wave driving apparatus relatively displacing the vibrating body and the contact body, wherein the stacked piezoelectric element comprises a plurality of piezoelectric layers consisting of a piezoelectric material, and a plurality of conductive layers formed respectively between at least three of the piezoelectric layers, further wherein the plurality of conductive layers includes a first conductive layer that is conductive with an electrode exposed on the surface of the stacked piezoelectric element and a second conductive layer that is not conductive therewith.

In a sixth aspect of the present invention, there is provided a vibration wave driving apparatus comprising a stacked piezoelectric element, a vibrating body formed on the surface of the stacked piezoelectric element, and a contact body arranged to, when pressed, contact the vibrating body, the vibration wave driving apparatus relatively displacing the vibrating body and the contact body, wherein the stacked piezoelectric element comprises at least three first piezoelectric layers consisting of a piezoelectric material, at least three second piezoelectric layers consisting of the piezoelectric material, a plurality of conduction layers formed respectively between first piezoelectric layers at positions that are conductive with an electrode exposed on the surface of the stacked piezoelectric element, and plurality of non-conduction layers formed respectively between the second piezoelectric layers at a position that is not conductive with the electrode exposed on the surface of the stacked piezoelectric element, further wherein the plurality non-conduction layers are formed by a material that contracts earlier during firing than the first and second piezoelectric layers.

Further features and aspects of the present invention will become apparent from the following detailed description of exemplary embodiments with reference to the attached drawings.

BRIEF DESCRIPTION OF THE DRAWINGS

FIGS. 4A and 4B are diagrams for explaining a manufacturing method for a stacked piezoelectric element structure according to a second embodiment of the present invention.

FIGS. 6A and 6B are diagrams for explaining a manufacturing method for a stacked piezoelectric element structure according to a third embodiment of the present invention.

FIGS. 8A and 8B are diagrams showing bend vibrations excited in the vibrating body depicted in FIG. 7. FIG. 8A is a diagram showing a case in which a secondary out-of-plane bending vibration is excited, while

DETAILED DESCRIPTION OF THE PREFERRED EMBODIMENTS

The following description of exemplary embodiments, features and aspects of the present invention is merely illustrative in nature and is in no way intended to limit the invention, its application, or uses.

First Embodiment

<Structure of Stacked Piezoelectric Element 1>

Figure 1:
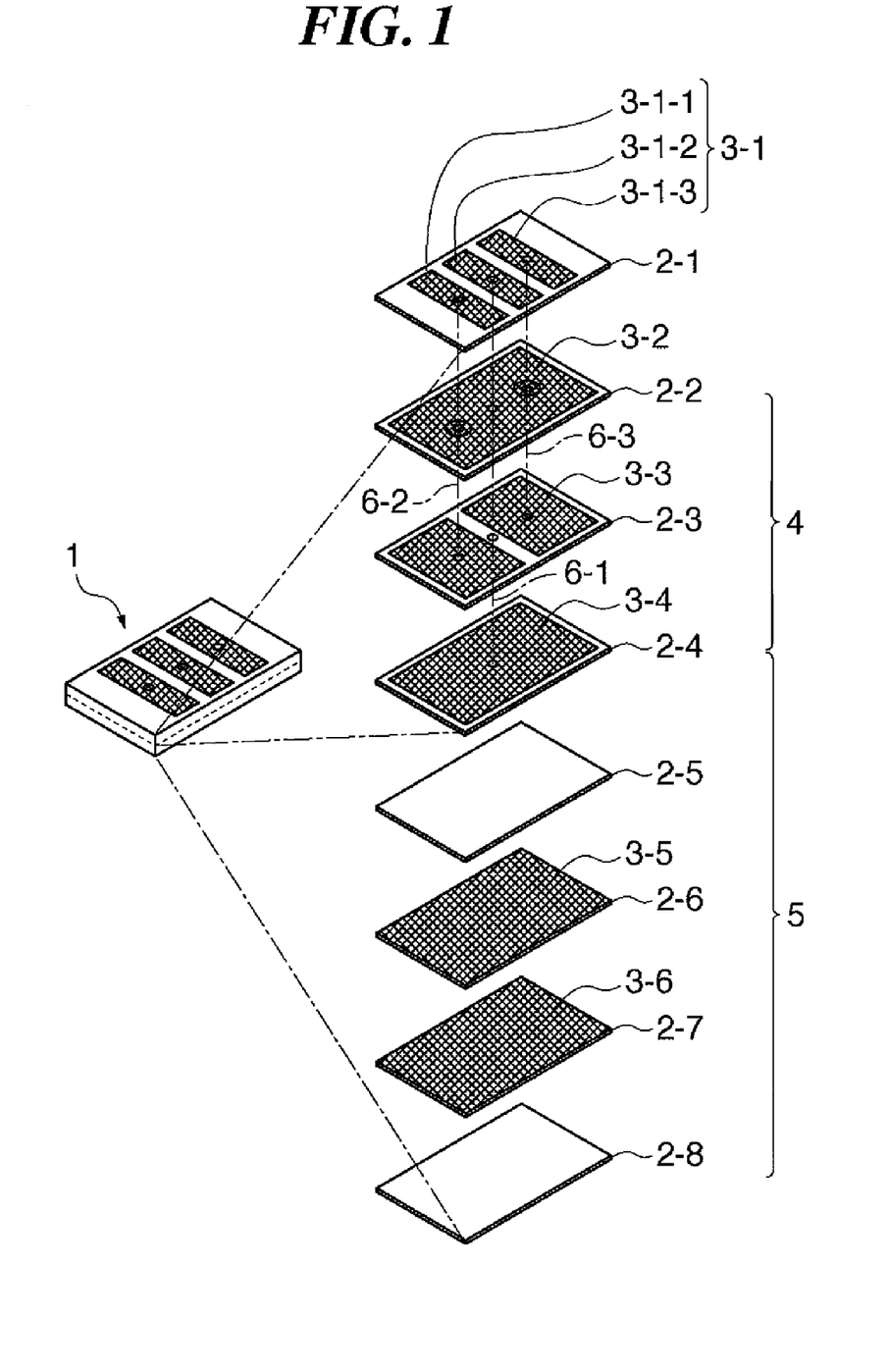
FIG. 1 is a diagram showing a configuration of a stacked piezoelectric element according to a first embodiment of the present invention.

FIG. 1 is a diagram showing a configuration of a stacked piezoelectric element according to a first embodiment of the present invention. In addition, FIG. 2 is a cross-sectional diagram of the stacked piezoelectric element shown in FIG. 1 taken in a longitudinal direction thereof.

Figure 2:
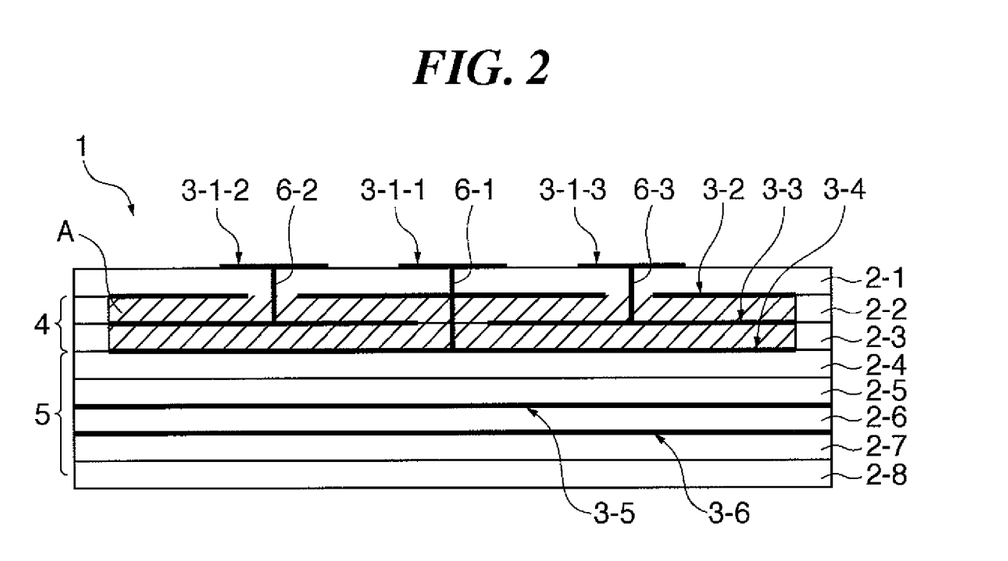
FIG. 2 is a cross-sectional diagram of the stacked piezoelectric element shown in FIG. 1 taken in a longitudinal direction thereof.

In FIGS. 1 and 2, a stacked piezoelectric element 1 comprises a driving unit 4 that applies voltage to generate drive and vibrates the entire stacked piezoelectric element, and a non-driving unit 5 that does not apply voltage for vibrating the entire stacked piezoelectric element. In addition, the driving unit 4 and the non-driving unit 5 comprise piezoelectric layers 2-1 to 2-8 which are layers of piezoelectric material, and are also provided with conductive layers consisting of conductive material, namely, a surface electrode layer 3-1 formed thereon and electrode layers 3-2 to 3-6 formed therein.

The driving unit 4 comprises an electrode layer 3-2 that is an electrode smaller than the contour of the driving unit 4, a bisected electrode layer 3-3 that is also smaller than the contour of the driving unit 4, and an electrode layer 3-4 having the same shape as the electrode layer 3-2. The driving unit 4 also comprises a piezoelectric layer 2-2 sandwiched between the electrode layers 3-2 and 3-3; and a piezoelectric layer 2-3 sandwiched between the electrode layers 3-3 and 3-4.

The shaded area A in FIG. 2 represents a piezoelectric active region that applies voltage to the surface electrode layer 3-1 to perform electromechanical energy conversion. The piezoelectric active region vibrates within a plane parallel to the piezoelectric layers 2-2 and 2-3 (in a direction perpendicular to the direction of polarization), and is capable of creating two bend vibrations in the stacked piezoelectric element 1.

The electrode layers 3-2, 3-4 and the bisected electrode layer 3-3 of the driving unit 4 are arranged to be independently electrically conductive respectively via three throughholes 6-1, 6-2 and 6-3. The throughholes are holes penetrating the piezoelectric layers 2-1 to 2-3, which are filled with conductive material. The electrode layers 3-2, 3-4 and the bisected electrode layer 3-3 are also arranged to be independently conductive with trisected surface electrode layers 3-1-1, 3-1-2 and 3-1-3 provided on the surface of the uppermost layer. On the other hand, the non-driving unit 5 comprises piezoelectric layers 2-4 to 2-8, an electrode layer 3-5 extending to the contour of the piezoelectric layer 2-6 and covering the entire surface thereof, and an electrode layer 3-6 extending to the contour of the piezoelectric layer 2-7 and covering the entire surface thereof.

The driving unit 4 and the non-driving unit 5 are simultaneously stacked to be integrated, and then fired. Subsequently, polarization using the surface electrode layer 3-1 is performed as described later to provide a predetermined polarity. However, since the electrode layers 3-5 and 3-6 of the non-driving unit 5 are not conductive via throughholes and the like, the piezoelectric layers 2-5, 2-6 and 2-7 that are adjacent to the electrode layers 3-5 and 3-6 will not be polarized.

In addition, the throughholes 6-1, 6-2 and 6-3 are also used when applying voltage to piezoelectric layers when driving a vibrating body 8, as will be described later with reference to FIG. 7. Therefore, the electrode layers 3-2, 3-3 and 3-4 of the driving unit 4, to which voltage is applied, are arranged not to be exposed on the outer periphery of the stacked piezoelectric element 1. This is because electrode layers 3-2, 3-3 and 3-4 arranged to be exposed may possibly result in current leakage or short circuit caused by condensation or adherence of foreign objects. On the other hand, since the electrode layers 3-5 and 3-6 of the non-driving unit 5 are independent of driving the vibrating body 8, and voltage will not be applied thereto, the electrode layers 3-5 and 3-6 are exposed on the outer periphery of the stacked piezoelectric element 1.

The driving unit 4 and the non-driving unit 5 form a unimorph, and the non-driving unit 5 is set to have a thickness that enables generation of bend vibrations at the stacked piezoelectric element 1. This is due to the fact that vibration energy generated by the driving unit 4 cannot be efficiently extracted as bend vibrations if the non-driving unit 5 is too thin.

The stacked piezoelectric element 1 of the present embodiment has a tabular shape with a vertical length of 5.5 mm, a width of 3.5 mm, and a thickness of 0.42 mm. The thickness of each of the piezoelectric layers 2-1 to 2-8 is 60 μm, and the diameter of each of the throughholes 6-1 to 6-3 is 0.1 mm. As described later, the thickness of each of the electrode layers 3-2 to 3-4 of the driving unit 4 is 2 to 3 μm, while the thickness of each of the electrode layers 3-5 and 3-6 of the non-driving unit 5 is 5 to 7 μm, which is approximately 2.5 times the thickness of each of the electrode layers 3-2 to 3-4 of the driving unit 4.

As piezoelectric material for the respective piezoelectric layers 2-1 to 2-8, piezoelectric ceramics of a three-component system or a multi-component system is used, which is formed by solid solution-forming of zirconate and titanate ($PbZrO_3$—$PbTiO_3$) including lead and having perovskite-like crystalline structures as a main component and are added with a small amount of a compound consisting of a plurality of metallic elements. Each of the piezoelectric layers 2-1 to 2-8 is comprised of a green sheet consisting of a powder of the piezoelectric ceramics and an organic binder.

<Manufacturing Method for Stacked Piezoelectric Element 1>

Figure 3:
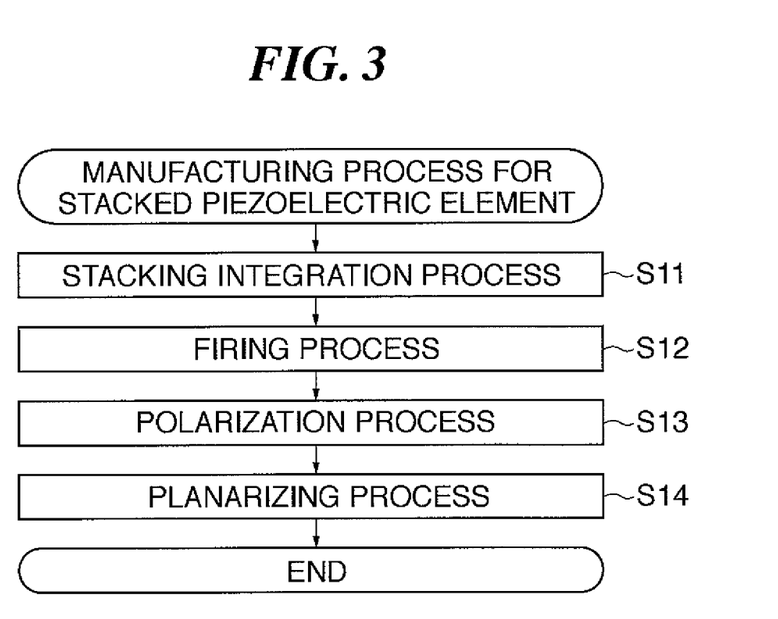
FIG. 3 is a flowchart showing manufacturing processes for a stacked piezoelectric element.

FIG. 3 is a flowchart showing manufacturing processes for the stacked piezoelectric element 1.

(A) Stacking Integration Process (Step S11)

After clipping the above-described green sheet into a certain shape and dimension, a conductive paste, primarily consisting of a silver-palladium powder which is a conductive material and mixed with an organic vehicle, is screen-printed on the clipped green sheets which will respectively become the piezoelectric layers 2-1 to 2-4, 2-6 and 2-7. Subsequently, the green sheets to become the piezoelectric layers 2-1 to 2-8 are sequentially stacked upon each other and pressurized for stacking integration.

The conductive paste is primarily comprised of conductive material made using the coprecipitation method and consisting of spherical silver-palladium powder (80 weight percent of silver and 20 weight percent of palladium) having an average particle diameter of 1.2 μm. Next, piezoelectric ceramic powder having an average particle diameter of 0.4 μm which was used when creating the above-described green sheets is added and mixed into the silver-palladium powder. Mixing of the piezoelectric ceramic powder is performed in order to delay sintering to approximate contraction of the conductive material with respect to sintering temperature to that of piezoelectric ceramics, because sintering of conductive material, being metal, proceeds at a lower temperature and at a higher rate than piezoelectric ceramics. In other words, the mixing is performed in order to suppress contraction of the conductive paste during sintering.

15 weight percent of piezoelectric ceramic powder will be added to the conductive paste that will form the electrode layers 3-2 to 3-4 of the driving unit 4, while 5 weight percent of piezoelectric ceramic powder will be added to the conductive paste that will form the electrode layers 3-5 and 3-6 of the non-driving unit 5. The mixing ratio of conductive material with respect to the conductive paste that will form the electrode layers 3-5 and 3-6 of the non-driving unit 5 is set higher than the mixing ratio of conductive material with respect to the conductive paste that will form the electrode layers 3-2 to 3-4 of the driving unit 4, and the coated amount of the conductive paste per unit area is also increased. Since the organic vehicle will be burned away during firing described below, the organic vehicle is not included in the mixing ratios.

(B) Firing Process (Step S12)

Next, the green sheets after the above-described stacking integration is fired in lead atmosphere at a predetermined temperature (for instance, 1100 degrees Celsius) to perform integral sintering. Upon commencement of firing, the organic binder of the green sheets and the organic vehicle of the conductive paste will burn away. After sintering is concluded, the green sheets are now sintered so that the piezoelectric ceramics become the piezoelectric layers 2-1 to 2-8, while the conductive material powder in the conductive paste are now sintered to become the electrode layers 3-1 to 3-6 having conductivity.

In the present embodiment, as described earlier, 15 weight percent of piezoelectric ceramic powder will be added to the conductive paste that will form the electrode layers 3-2 to 3-4 of the driving unit 4, while 5 weight percent of piezoelectric ceramic powder will be added to the conductive paste that will form the electrode layers 3-5 and 3-6 of the non-driving unit 5. In addition, the mixing ratio of conductive material with respect to the conductive paste that will form the electrode layers 3-5 and 3-6 of the non-driving unit 5 is increased. As a result, the time required for sintering of the electrode layers 3-5 and 3-6 of the non-driving unit 5 during firing will be reduced, and the peripheral contraction will increase. As a result, warping of the stacked piezoelectric element 1 may be suppressed. Furthermore, the increase of the ratio of conductive material will result in an increase thickness of the electrode layers.

Moreover, since the coated amount of the conductive paste per unit area is increased as described earlier, sintering of the electrode layers 3-5 and 3-6 of the stacked piezoelectric element 1 during firing will proceed at an even faster rate, and the peripheral contraction may be further increased.

The coated amount of the conductive paste may be altered by changing the print thickness of a screen used for the screen-printing (thickness of the screen and thickness of emulsion on the screen) or changing the mesh used for the screen-printing. Increasing the coated amount results in an increase in the thickness of the electrode layers.

In the present embodiment, the above-described conductive paste with a 5 weight percent additive amount of piezoelectric ceramic powder is used to ultimately provide the electrode layers 3-5 and 3-6 with a thickness of 5 to 7 μm after sintering. As a result, the above-described layer configuration according to the present embodiment may sufficiently suppress warping of the driving unit 4.

When using a conductive paste having a 15 weight percent additive amount of piezoelectric ceramic powder, it is desirable to increase the thickness of the electrode layers 3-5 and 3-6 to around 10 μm.

In addition, other conductive material manufactured using methods other than the coprecipitation method or having different particle diameters may be applied by altering additive amounts of piezoelectric ceramic powder to obtain the same effects as those obtained by the embodiment. The piezoelectric ceramic powder to be added need not be the same as that used for the piezoelectric layers 2-1 to 2-8, and the same effect may be obtained by using those with different particle diameters. Furthermore, the number of piezoelectric layers with respect to the piezoelectric layers 2-4 to 2-8 of the non-driving unit 5 may be reduced by using a sheet that is thicker than the piezoelectric layers 2-1 to 2-3 of the driving unit 4.

(C) Polarization Process (Step S13)

Polarization of the piezoelectric layers 2-1 to 2-8 formed through the above-described firing is performed. For the polarization process, pores that will become the three throughholes 6-1, 6-2 and 6-3 are first formed on the electrode layers 3-1 to 3-3 and the piezoelectric layers 2-1 to 2-3. The pores are then filled with conductive material to form the throughholes 6-1 to 6-3. Subsequently, metallic pins (not shown) are respectively pressed against the surface electrode layers 3-1-1, 3-1-2 and 3-1-3 that are linked to the respective throughholes 6-1 to 6-3. Next, polarization is performed by grounding (G) the surface electrode layer 3-1-1 while arranging the surface electrode layers 3-1-2 and 3-1-3 to assume positive (+) polarity, and applying a predetermined voltage (for instance, 200 V) in oil of a predetermined temperature (for instance, 100 to 150 degrees Celsius) over approximately 10 to 30 minutes. As a result, the piezoelectric layers 2-2 and 2-3 are polarized with the electrode layers 3-2 and 3-4 grounded (G) and the electrode layer 3-3 assuming positive (+) polarity.

(D) Planarizing Process (Double-Side Lapping/Frat Surface Grinding) (Step S14)

After processing the polarization as described above, double-side lapping or frat surface grinding is performed to grind and planarize the upper and lower surfaces of the stacked piezoelectric element 1. Half of the thickness (approximately 30 μm) of the piezoelectric layers 2-1 and 2-8 are grinded off from the surfaces thereof, and the surface electrode layer 3-1 is also grinded off.

A flexible circuit board is adhered to a predetermined position aligned at the edges of the throughholes 6-1 to 6-3 that are exposed after grinding off the electrode layer 3-1, positioned at the uppermost surface of the stacked piezoelectric element 1, through the processing. As a result, connection to a driving circuit (not shown) may be realized using the exposed throughholes 6-1 to 6-3 as electrodes.

Advantages of the First Embodiment

With a conventional stacked piezoelectric element, a full-surface electrode layer extending to the contour of the stacked piezoelectric element, which corresponds to the electrode layers 3-5 and 3-6 according to the present embodiment, is not provided at a non-driving unit. As a result, occurrences of warping are prominent in the conventional stacked piezoelectric element after sintering and polarization. Therefore, the surface planarization of the conventional stacked piezoelectric element results in exposing an electrode layer corresponding to the electrode layer 3-2 according to the present embodiment. Therefore, the conventional stacked piezoelectric element after surface planarizing the surface thereof is not suitable for use as a vibrating body in a vibration wave motor.

On the other hand, in the present embodiment, the non-driving unit 5 is provided with the full-surface electrode layers 3-5 and 3-6 extending to the contour, which are arranged to be thicker than the respective electrode layers 3-1 to 3-4 of the driving unit 4 by increasing the ratio of conductive material in the conductive paste or the coated amount thereof. While each of the electrode layers 3-5 and 3-6 is independently capable of suppressing warping of the element 1, the combined use thereof enables suppression of occurrences of warping in the element 1 using a small number of electrode layers. Therefore, the element 1 is capable of preventing exposure of the electrode layer 3-2 at the surface, and a good configuration is realized.

In addition, by forming the electrode layers 3-5 and 3-6 of the non-driving unit 5 with increasing an ratio of conductive material or a coated amount thereof, compared to the electrode layers 3-2 to 3-4 of the driving unit 4, the number of electrode layers of the non-driving unit 5 may be minimized compared to the number of electrode layers of the driving unit 4. As a result, manufacturing time may be reduced and cost reduction may be achieved.

Second Embodiment

An embodiment will now be described in which individual stacked piezoelectric elements are separated from a stacked piezoelectric element plate on which a plurality of stacked piezoelectric elements described for the first embodiment is disposed. More specifically, in consideration of mass production of small-sized elements, a second embodiment is arranged to increase productivity by simultaneously creating a number of elements instead of one element at a time.

Figure 4A:
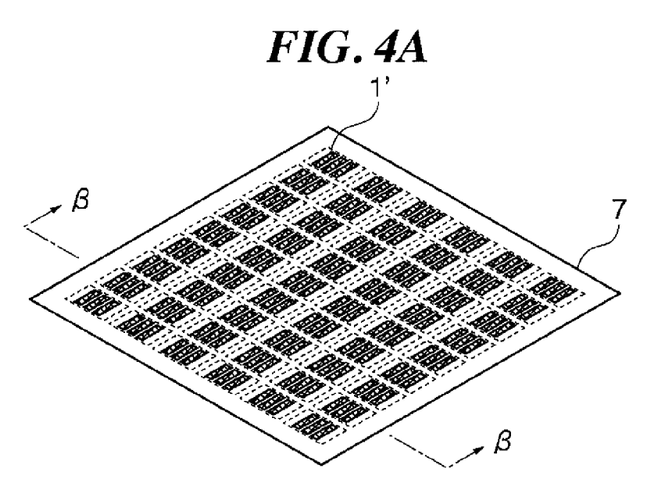
FIG. 4A is a perspective view of a stacked piezoelectric element plate.
Figure 4B:
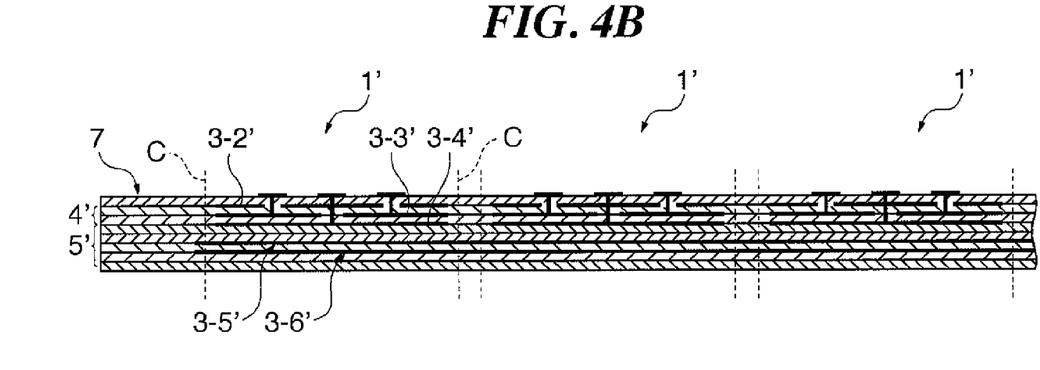
FIG. 4B is a cross-sectional diagram taken along the line β-β shown in FIG. 4A.

FIGS. 4A and 4B are diagrams for explaining a manufacturing method for a stacked piezoelectric element according to the second embodiment of the present invention. FIG. 4A is a perspective view of a stacked piezoelectric element plate, and FIG. 4B is a cross-sectional diagram taken along the line β-β shown in FIG. 4A.

In FIG. 4A, on an approximately 40 mm by 40 mm stacked piezoelectric element plate 7, elements 1', corresponding to the stacked piezoelectric element 1 according to the first embodiment described earlier, are arranged nine deep and six wide. An element 1' may be cut out from the stacked piezoelectric element plate 7 by cutting and separating along the dashed line C indicated in FIG. 4B.

As shown in FIG. 4B, while electrode layers 3-2', 3-3' and 3-4' of a driving unit 4' are respectively separated by individual stacked piezoelectric elements 1' in the same manner as shown in FIG. 2, electrode layers 3-5' and 3-6' of a non-driving unit 5' are provided on substantially the entire surface of the stacked piezoelectric element plate 7. In addition, the thickness of the electrode layers 3-5' and 3-6' of the non-driving unit 5' are set at 5 to 7 μm, which is approximately 2.5 times the thickness of the electrode layers 3-2', 3-3' and 3-4' of the driving unit 4'. Other conditions including the material and thickness of the piezoelectric layers and the electrode layers, as well as the conductive paste used therefor, are basically the same as the first embodiment.

Advantages of the Second Embodiment

Figure 5:
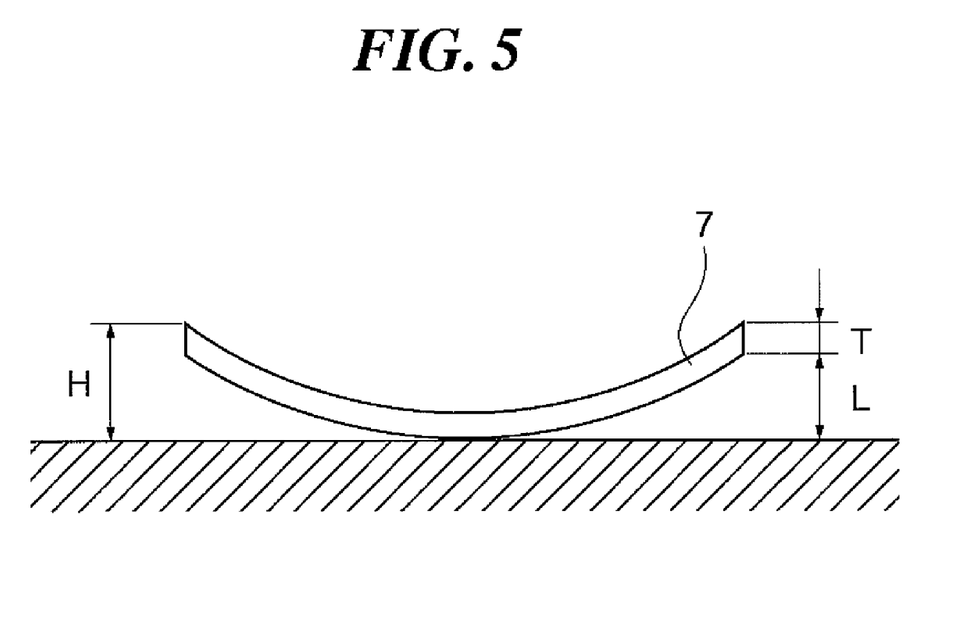
FIG. 5 is a diagram illustrating warping of the stacked piezoelectric element plate shown in FIG. 4A.

With a conventional example, when sintering and polarization are performed with the surface electrode layer facing up, the non-driving unit is not provided with electrode layers corresponding to the full-surface electrode layers 3-5' and 3-6' according to the present embodiment. Therefore, a conventional stacked piezoelectric element plate will have significant warping. More specifically, as shown in FIG. 5, if H represents the height of a convex portion of the stacked piezoelectric element plate 7 caused by deformation due to warping, and T represents the thickness of the stacked piezoelectric element plate 7, a warping L of the stacked piezoelectric element plate 7 may be expressed by the following formula.

$$H-T=L$$

Using this formula, the warping L of the conventional example of the stacked piezoelectric element plate may be obtained as 50 to 70 μm.

In contrast, since the present embodiment is provided with the electrode layers 3-5' and 3-6', the warping L of the stacked piezoelectric element plate 7 is 5 to 10 μm, which is a significant reduction from the conventional stacked piezoelectric element. If the warping L may be kept at this level, the electrode layer 3-2' will not be exposed even after planarization of the stacked piezoelectric element plate 7 is subsequently performed without modifying the stacked piezoelectric element plate 7 by grinding the upper and lower surfaces thereof through double-side lapping or surface grinding. Additionally, by separating the stacked piezoelectric element 1' from the stacked piezoelectric element plate 7 and using the element 1' as a vibrating body 8 of a vibration wave motor 11 to be described later with reference to FIG. 7, good operation results of the vibration wave motor 11 may be obtained.

Third Embodiment

Figure 6A:
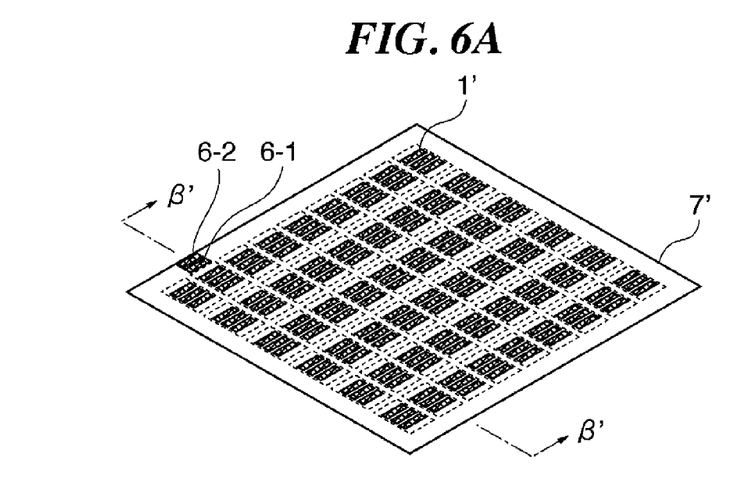
FIG. 6A is a perspective view of a stacked piezoelectric element plate.
Figure 6B:
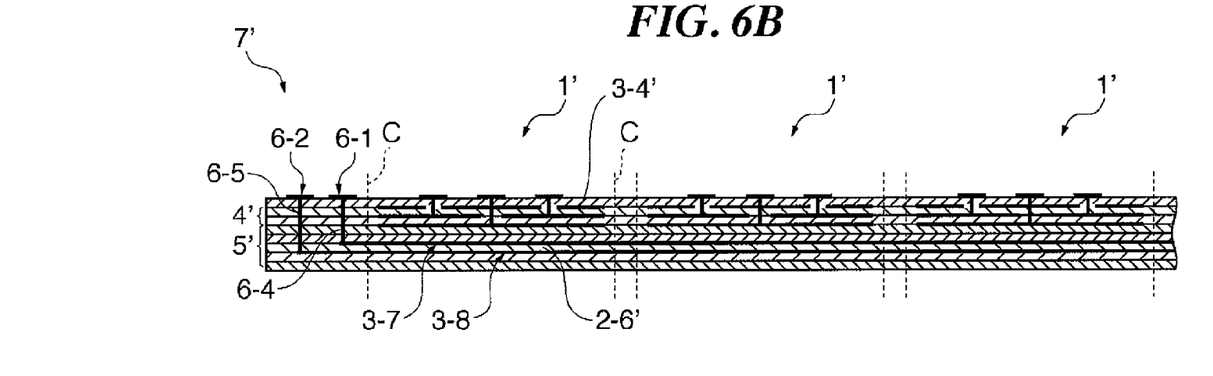
FIG. 6B is a cross-sectional diagram taken along the line β-β shown in FIG. 6A.

FIGS. 6A and 6B are diagrams for explaining a manufacturing method for a stacked piezoelectric element according to a third embodiment of the present invention. FIG. 6A is a perspective view of a stacked piezoelectric element plate, and FIG. 6B is a cross-sectional diagram taken along the line β'-β' shown in FIG. 6A.

In FIG. 6A, a stacked piezoelectric element plate 7' has approximately the same external appearance as the stacked piezoelectric element plate 7 depicted in FIG. 4A. On the approximately 40 mm by 40 mm stacked piezoelectric element plate 7', stacked piezoelectric elements 1' are arranged nine long and six wide.

The third embodiment differs from the above-described second embodiment in that, at the edge of the stacked piezoelectric element plate 7', surface electrodes 6-1 and 6-2 are connected to electrode layers 3-7 and 3-8 provided substantially over the entire surface of a non-driving unit 5' via throughholes 6-4 and 6-5.

In addition, using the surface electrodes 6-1 and 6-2 and the throughholes 6-4 and 6-5, polarization of the non-driving unit 5' as well as polarization of a piezoelectric layer 2-6' are performed by grounding (G) the electrode layer 3-7 and arranging the electrode layer 3-8 to assume positive (+) polarity.

Since an electrode layer 3-4' of a driving unit 4' side is also grounded (G), a piezoelectric layer between the electrode layer 3-4' and the electrode layer 3-7 will not be polarized. Other conditions including the material and thickness of the piezoelectric layers and the electrode layers, as well as the conductive paste used therefor, are basically the same as the second embodiment.

Advantages of the Third Embodiment

In the stacked piezoelectric element plate 7' arranged in this manner, polarization of the piezoelectric layer 2-6' is also performed using the electrode layers 3-7 and 3-8 of the non-driving unit 5'. Then, using the formula described in the second embodiment, the warping L of the stacked piezoelectric element plate 7' may be measured as being 0 to 5 μm, which is a significant reduction from the conventional example.

Subsequently, by performing double-side lapping on the stacked piezoelectric element plate 7', extracting the stacked piezoelectric element 1' by cutting and separating along the dashed line C indicated in FIG. 6B, and using the element 1' as a vibrating body 8 of a vibration wave motor 11 to be described later with reference to FIG. 7, good operation results of the vibration wave motor 11 are obtained. The stacked piezoelectric element 1' cut out from the stacked piezoelectric element plate 7' is separated from the through-holes 6-4 and 6-5, and during driving of the vibration wave motor 11, voltage is not applied to the piezoelectric layer 2-6', which forms the non-driving unit 5'.

As seen, by polarizing a portion of the piezoelectric layers of the non-driving unit 5' using the electrode layers of the non-driving unit 5', warping in an opposite direction to the polarized piezoelectric layer may be generated. As a result, warping of the stacked piezoelectric element 1' may be further reduced. However, since polarization causes generation of an electrical charge between electrode layers due to vibrations during driving resulting in a phenomenon in which mechanical rigidity increases only in piezoelectric layers, it is desirable to suppress such increase in rigidity by arranging electrode layers in the polarized piezoelectric layers to be conductive with each other.

It is obvious that the number of electrode layers may be increased in addition to the full-surface electrode layers 3-5', 3-6' (FIG. 4B) and the full-surface electrode layers 3-7, 3-8 (FIG. 6B) of the non-driving unit 5', and polarization may be performed between such electrode layers. In addition, since an example in which an electrode layer of the driving unit configured of three layers has been described for the first to third embodiments, the number of electrode layers need not be limited to these examples as long as vibrations may be generated at the stacked piezoelectric element.

Fourth Embodiment

Figure 7:
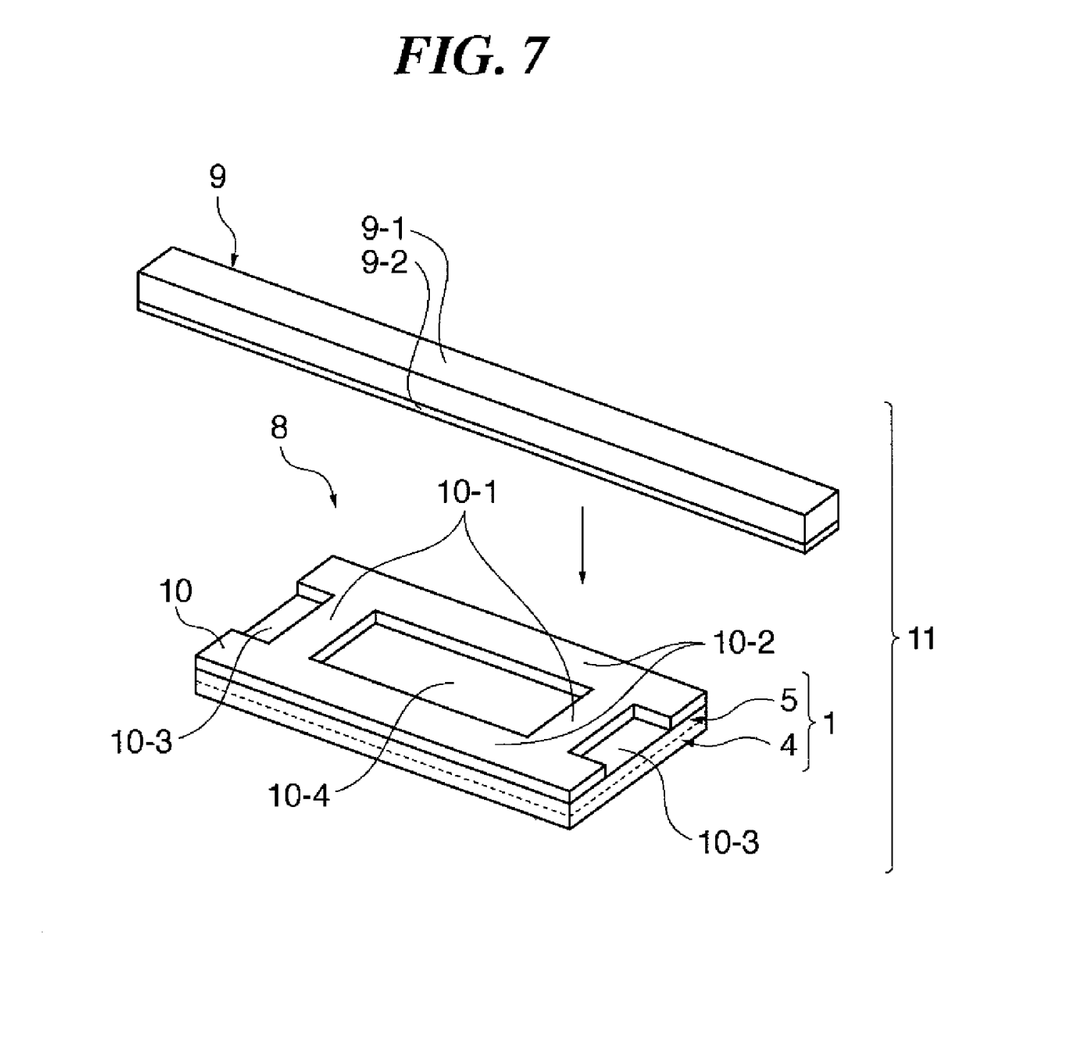
FIG. 7 is a perspective view showing a configuration of a vibration wave motor as a vibration wave driving apparatus according to an embodiment of the present invention.

FIG. 7 is a perspective view showing a configuration of a vibration wave motor as a vibration wave driving apparatus according to an embodiment of the present invention. In the following description, however, description will be given of the stacked piezoelectric element 1 used in a vibration wave motor, the stacked piezoelectric element 1' may also be used in a similar configuration.

As shown in FIG. 7, a variation wave motor 11 comprises a vibrating body 8 provided with the stacked piezoelectric element 1, and a slider 9. A plate-like friction material 10 is adhered to the surface of the non-driving unit 5 of the stacked piezoelectric element 1 having a tabular shape. The friction material 10 is formed of a metallic material that combines a high coefficient of friction and a high resistance to friction.

The friction material 10 is composed of portions 10-1 and 10-2 having a uniform thickness, and laminar sections 10-3 and 10-4 that are thinner than the portions 10-1 and 10-2. The laminar sections 10-3 and 10-4 of the friction material 10 are formed by performing etching on a laminar metallic material to partially reduce thickness. The portions 10-1 of the friction material 10 are formed between the laminar sections 10-3 and 10-4, and will be used as a contact section with respect to the slider 9.

On the other hand, the slider 9 is composed of a slider base section 9-1, and a friction material 9-2 jointed thereto which also combines a high coefficient of friction and a high resistance to friction. When pressed, the friction material 9-2 of the slider 9 contacts the portions 10-1 of the friction material 10.

A flexible circuit board is adhered to a predetermined position on the surface of the stacked piezoelectric element 1 comprising the vibrating body 8 to enable connection with a driving circuit (not shown).

Figure 8A:
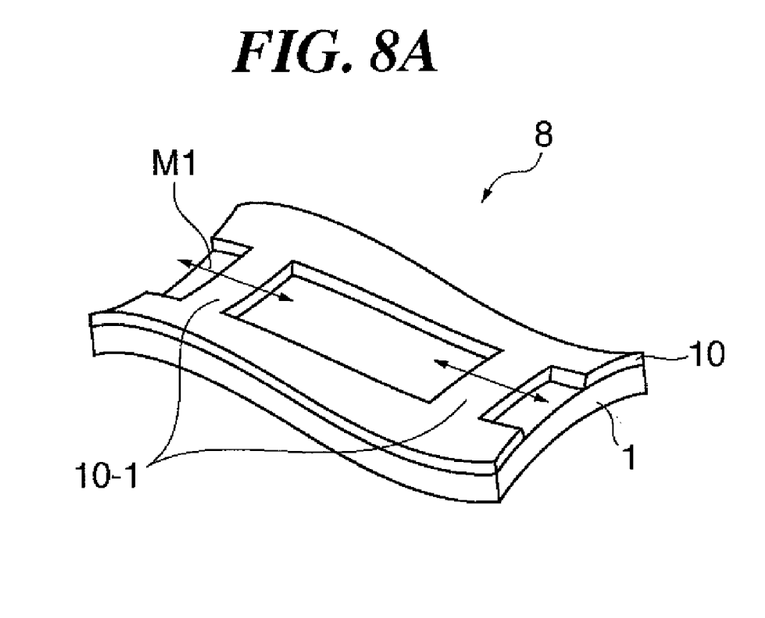
Figure 8B:
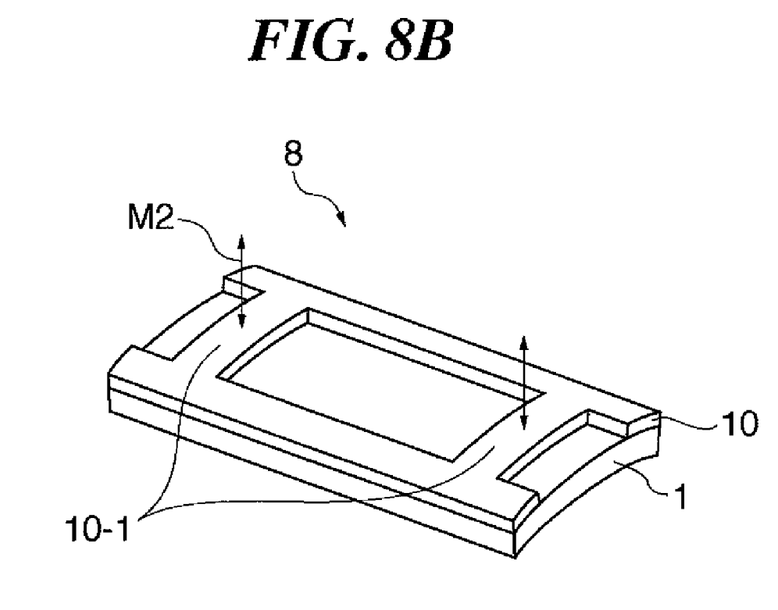
FIG. 8B is a diagram showing a case in which a primary out-of-plane bending vibration is excited.

FIGS. 8A and 8B are diagrams showing bend vibrations excited in the vibrating body 8 depicted in FIG. 7. FIG. 8A is a diagram showing a case in which a secondary out-of-plane bending vibration is excited, while FIG. 8B is a diagram showing a case in which a primary out-of-plane bending vibration is excited.

By grounding the electrode layers 3-2 and 3-4 (FIG. 1) of the stacked piezoelectric element 1 used in the vibrating body 8, one of two high-frequency voltages having a phase difference is applied to one portion of the bisected electrode layer 3-3 (FIG. 1), and the other of the two high-frequency voltages is applied to the other. As a result, two different bend vibrations with a temporal phase difference shifted by 90 degrees, as shown in FIGS. 8A and 8B, may be generated simultaneously.

The bend vibration shown in FIG. 8A is a secondary out-of-plane bending vibration, while the bend vibration shown in FIG. 8B is a primary out-of-plane bending vibration. The shape of the vibrating body 8 is designed so that the resonance frequencies of the two bend vibrations approximately match each other. The portions 10-1 of the friction material 10 are respectively positioned in the vicinity of alternately different nodes of the secondary out-of-plane bending vibration, and are displaced in a longitudinal direction (M1) of the vibrating body 8 due to the vibration. In addition, the portions 10-1 of the friction material 10 are positioned in the vicinity of alternately different antinodes of primary out-of-plane bending vibration, and are also displaced in a thickness direction (M2).

By generating a complex vibration consisting of the two different bend vibrations, an elliptic motion or a circular motion may be generated on the portions 10-1 of the friction material 10 that are adhered to the stacked piezoelectric element 1 comprising the vibrating body 8. As a result, by pressing the surface of the portions 10-1 of the vibrating body 8 to contact the slider 9, an elliptic motion or a circular motion generated on the surface causes the slider 9 to perform a linear motion with respect to the vibrating body 8. In other words, by pressing the surface of the portions 10-1 of the vibrating body 8 to contact the slider 9, relative motion is formed between the vibrating body 8. As a result, the vibration wave motor 11 (FIG. 7) that provides linear driving may be configured.

The width and length of the stacked piezoelectric element 1 comprising the vibrating body 8 is substantially equal to that of the friction material 10. The thickness of the friction material 10 prior to etching is 0.6 mm; the thickness of the portions 10-1 and 10-2 is 0.1 mm; and the thickness of the laminar sections 10-3 and 10-4 is 50 µm.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-108862 filed Apr. 11, 2006 which is hereby incorporated by reference herein in its entirety.

What is claimed is:

1. A stacked piezoelectric element comprising:
    a driving unit having a first conductive layer and a first piezoelectric layer consisting of a piezoelectric material, which is driven by an application of voltage to said first conductive layer to generate vibration on the stacked piezoelectric element; and
    a non-driving unit having a plurality of second conductive layers to which no voltage is applied and a plurality of second piezoelectric layers consisting of the piezoelectric material, which is arranged to have a thickness that enables generation of the vibration,
    wherein each of said plurality of second conductive layers is thicker than said first conductive layer.

2. The stacked piezoelectric element according to claim 1, wherein the area of each of said plurality of second conductive layers is larger than that of said first conductive layer.

3. The stacked piezoelectric element according to claim 1, wherein:
    said first conductive layer and said plurality of second conductive layers are formed respectively using first and second conductive pastes, and
    the coated amount per unit area of the second conductive paste is larger than that of the first conductive paste.

4. The stacked piezoelectric element according to claim 1, wherein:
    said first conductive layer and said plurality of second conductive layers are formed respectively using first and second conductive pastes, and
    the ratio of a conductive material that is a primary component of the first and second conductive pastes is greater in the second conductive paste than in the first conductive paste.

5. The stacked piezoelectric element according to claim 1, wherein said plurality of second piezoelectric layers are respectively sandwiched between said plurality of second conductive layers to be polarized.

6. A stacked piezoelectric element comprising:
    a plurality of piezoelectric layers consisting of a piezoelectric material; and
    a plurality of conductive layers formed respectively between at least three of said piezoelectric layers,
    wherein said plurality of conductive layers include a first conductive layer, to which voltage is to be applied, that is conductive with an electrode exposed on the surface of the stacked piezoelectric element, and a second conductive layer, to which no voltage is to be applied, that is not conductive with the electrode, and
    wherein said second conductive layer is thicker than said first conductive layer.

7. The stacked piezoelectric element according to claim 6, wherein the area of said second conductive layer is larger than that of said first conductive layer.

8. The stacked piezoelectric element according to claim 6, wherein:
    said first and second conductive layers are formed respectively using first and second conductive pastes, and
    the coated amount per unit area of the second conductive paste is greater than that of the first conductive paste.

9. The stacked piezoelectric element according to claim 6, wherein:
    said first and second conductive layers are formed respectively using first and second conductive pastes, and
    the ratio of a conductive material that is a primary component of the first and second conductive pastes is greater in the second conductive paste than in the first conductive paste.

10. A stacked piezoelectric element comprising:
    at least three first piezoelectric layers consisting of a piezoelectric material;
    at least three second piezoelectric layers consisting of the piezoelectric material;
    a plurality of first layers formed respectively between said first piezoelectric layers at positions that are conductive with an electrode exposed on the surface of the stacked piezoelectric element, wherein said plurality of first layers are conductive layers; and
    a plurality of second layers formed respectively between said second piezoelectric layers at a position that is not conductive with said electrode exposed on the surface of the stacked piezoelectric element,
    wherein said plurality of second layers are formed of a material that contracts earlier during firing than said plurality of first layers.

11. The stacked piezoelectric element according to claim 10, wherein said plurality of second layers include conductive material.

12. A vibration wave driving apparatus comprising:
    a stacked piezoelectric element;
    a vibrating body formed on the surface of said stacked piezoelectric element; and
    a contact body arranged to, when pressed, contact said vibrating body,
    wherein said vibration wave driving apparatus relatively displaces said vibrating body and said contact body, and
    wherein said stacked piezoelectric element comprises:
    a driving unit having a first conductive layer and a first piezoelectric layer consisting of a piezoelectric material, which is driven by an application of voltage to said first conductive layer to generate vibration on said stacked piezoelectric element; and
    a non-driving unit having a plurality of second conductive layers to which no voltage is applied and a plurality of second piezoelectric layers consisting of the piezoelectric material, which is arranged to have a thickness that enables generation of the vibration,
    wherein each of said plurality of second conductive layers is thicker than said first conductive layer.

13. A vibration wave driving apparatus comprising:
    a stacked piezoelectric element;
    a vibrating body formed on the surface of said stacked piezoelectric element; and
    a contact body arranged to, when pressed, contact said vibrating body,
    wherein said vibration wave driving apparatus relatively displaces said vibrating body and said contact body, and
    wherein said stacked piezoelectric element comprises:
    a plurality of piezoelectric layers consisting of a piezoelectric material; and
    a plurality of conductive layers formed respectively between at least three of said piezoelectric layers, wherein said plurality of conductive layers include a first conductive layer, to which voltage is to be applied, that is conductive with an electrode exposed on the surface of said stacked piezoelectric element, and a second conductive layer, to which no voltage is to be applied, that is not conductive with the electrode, and wherein said second conductive layer is thicker than said first conductive layer.

14. A vibration wave driving apparatus comprising:

a stacked piezoelectric element;

a vibrating body formed on the surface of said stacked piezoelectric element; and a contact body arranged to, when pressed, contact said vibrating body, wherein said vibration wave driving apparatus relatively displacing said vibrating body and said contact body, wherein said stacked piezoelectric element comprises:

at least three first piezoelectric layers consisting of a piezoelectric material;

at least three second piezoelectric layers consisting of the piezoelectric material;

a plurality of first layers formed respectively between first piezoelectric layers at positions that are conductive with an electrode exposed on the surface of said stacked piezoelectric element, wherein said plurality of first layers are conductive layers; and a plurality of second layers formed respectively between said second piezoelectric layers at a position that is not conductive with said electrode exposed on the surface of said stacked piezoelectric element, wherein said plurality of second layers are formed of a material that contracts earlier during firing than said plurality of first layers.

* * * * *

UNITED STATES PATENT AND TRADEMARK OFFICE
CERTIFICATE OF CORRECTION

| | |
|---|---|
| PATENT NO. | : 7,808,162 B2 |
| APPLICATION NO. | : 11/696177 |
| DATED | : October 5, 2010 |
| INVENTOR(S) | : Yutaka Maruyama et al. |

It is certified that error appears in the above-identified patent and that said Letters Patent is hereby corrected as shown below:

Title page, item (75) Inventor, address

REMOVE: "Toyko"
INSERT: -- Taito-ku --

Signed and Sealed this
Twenty-eighth Day of December, 2010

David J. Kappos
*Director of the United States Patent and Trademark Office*